(12) United States Patent
Gao et al.

(10) Patent No.: US 11,675,408 B2
(45) Date of Patent: Jun. 13, 2023

(54) COMPUTING DEVICE AND SERIES POWER SUPPLY METHOD

(71) Applicant: SHENZHEN MICROBT ELECTRONICS TECHNOLOGY CO., LTD., Guangdong (CN)

(72) Inventors: Yang Gao, Guangdong (CN); Yuefeng Wu, Guangdong (CN); Zuoxing Yang, Guangdong (CN); Hongyan Ning, Guangdong (CN); Haifeng Guo, Guangdong (CN)

(73) Assignee: SHENZHEN MICROBT ELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/913,592

(22) PCT Filed: Jan. 10, 2022

(86) PCT No.: PCT/CN2022/071021
§ 371 (c)(1),
(2) Date: Sep. 22, 2022

(87) PCT Pub. No.: WO2022/213692
PCT Pub. Date: Oct. 13, 2022

(65) Prior Publication Data
US 2023/0128337 A1   Apr. 27, 2023

(30) Foreign Application Priority Data
Apr. 7, 2021   (CN) .................. 202110372151.X (51) Int. Cl.
*G06F 1/26*     (2006.01)
*H05K 1/02*     (2006.01)
*G06F 1/3228*   (2019.01)

(52) U.S. Cl.
CPC ............ *G06F 1/266* (2013.01); *G06F 1/3228* (2013.01); *H05K 1/0218* (2013.01)

(58) Field of Classification Search
CPC ...... G06F 1/266; G06F 1/3228; H05K 1/0218
See application file for complete search history.

(56) References Cited

U.S. PATENT DOCUMENTS

| 2014/0277802 A1* | 9/2014 | Tomas ..................... G06F 1/28 |
| | | 700/292 |
| 2015/0288220 A1* | 10/2015 | Gurunathan ............. H02J 3/46 |
| | | 307/65 |

(Continued)

FOREIGN PATENT DOCUMENTS

| CN | 107947566 A | 4/2018 |
| CN | 108446004 A | 8/2018 |

(Continued)

OTHER PUBLICATIONS

International Search Report and Written Opinion dated Mar. 30, 2022 in International Patent Application PCT/DN2022/071021.

*Primary Examiner* — Zahid Choudhury
(74) *Attorney, Agent, or Firm* — Venable LLP (57) ABSTRACT

A computing device and a series power supply method are disclosed. The computing device includes: a hash board, including a series power supply circuit, which includes m layers of to-be-powered chips that are connected in series between a power supply positive electrode and a power supply negative electrode of the hash board, wherein highest-layer to-be-powered chips are connected to the power supply positive electrode, and bottommost-layer to-be-powered chips are connected to the power supply negative electrode, wherein the power supply positive electrode is configured to receive a higher potential relative to the power supply negative electrode; a control board, configured to provide, to the hash board, control signals and communica- (Continued)

tion signals that are accessed to the series power supply circuit through a communication interface of the highest-layer to-be-powered chips and communicated to lower layers through the m layers of to-be-powered chips that are connected in series.

16 Claims, 5 Drawing Sheets

(56) References Cited

U.S. PATENT DOCUMENTS

| | | | | |
|---|---|---|---|---|
| 2016/0043555 A1* | 2/2016 | Howell | | H02J 9/061 |
| | | | | 307/23 |
| 2016/0254744 A1* | 9/2016 | Andry | | H02M 1/08 |
| | | | | 327/541 |
| 2019/0369686 A1* | 12/2019 | Zhang | | G06F 1/26 |
| 2022/0046820 A1* | 2/2022 | Yang | | G06F 1/181 |

FOREIGN PATENT DOCUMENTS

| | | |
|---|---|---|
| CN | 208569545 U | 3/2019 |
| CN | 208608891 U | 3/2019 |
| CN | 214311489 U | 9/2021 |

\* cited by examiner

Fig. 5

COMPUTING DEVICE AND SERIES POWER SUPPLY METHOD

CROSS-REFERENCE TO RELATED APPLICATIONS

This application is a national stage entry of International Application No. PCT/CN2022/071021, filed on Jan. 10, 2022, which claims priority to Chinese Patent Application No. 202110372151.X, filed on Apr. 7, 2021. Both of the aforementioned applications are hereby incorporated by reference in their entireties.

TECHNICAL FIELD

The present disclosure relates generally to the technical field of power supply, in particular to the technical field of power supply for serially connected computing chips, and further specifically to a method for sharing one and the same kind of PCB in the case where chips in different layer levels are connected in series in a DC high-voltage series power supply circuit.

BACKGROUND

With the development of semiconductor technology, the operating power supply voltage of integrated circuit chips becomes lower, and the operating current becomes higher. In order to maximize the conversion efficiency of power supplies, power supplies for serially connected IC chips start to be adopted on printed circuit boards (PCBs) to form series power supply circuits in the related art. That is, a multi-stages of series voltage domains are formed between a power supply terminal and a ground terminal for the IC chips. In the art, a PCB plus the chips thereon as a whole is usually referred to as a hash board, which constitutes an important component of electrical devices. However, there are still some problems with the existing series power supply circuits using such a series power supply architecture.

Therefore, there arises a need to design a new optimized series power supply scheme.

SUMMARY

According to a first aspect of the present disclosure, there is provided a computing device comprising: a hash board, comprising a series power supply circuit disposed thereon, which includes m layers of to-be-powered chips that are connected in series between a power supply positive electrode of the hash board and a power supply negative electrode of the hash board, where m is an integer greater than 2, wherein highest-layer to-be-powered chips among the m layers of to-be-powered chips are connected to the power supply positive electrode of the hash board, and bottommost-layer to-be-powered chips among the m layers of to-be-powered chips are connected to the power supply negative electrode of the hash board, wherein the power supply positive electrode of the hash board is configured to receive a higher potential relative to the power supply negative electrode of the hash board; a control board, configured to provide, to the hash board, control signals and communication signals that are accessed to the series power supply circuit through a communication interface of the highest-layer to-be-powered chips in the series power supply circuit and communicated to lower layers through the m layers of to-be-powered chips that are connected in series, wherein in the case that the series power supply circuit on the hash board is configured to comprise m-n layers of to-be-powered chips, the bottommost n layers of to-be-powered chips are replaced with conductor patches.

According to a second aspect of the present disclosure, there is provided a series power supply method for supplying power to a series power supply circuit comprising m layers of to-be-powered chips, the series power supply method comprising: disposing the m layers of to-be-powered chips on a hash board and connecting in series between a power supply positive electrode of the hash board and a power supply negative electrode of the hash board, where m is an integer greater than 2; connecting highest-layer to-be-powered chips among the m layers of to-be-powered chips to the power supply positive electrode of the hash board, and connecting bottommost-layer to-be-powered chips among the m layers of to-be-powered chips to the power supply negative electrode of the hash board, wherein the power supply positive electrode of the hash board is configured to receive a higher potential relative to the power supply negative electrode of the hash board; connecting a control board to the hash board to provide, to the hash board, control signals and communication signals that are accessed to the series power supply circuit through a communication interface of the highest-layer to-be-powered chips in the series power supply circuit and communicated to lower layers through the m layers of to-be-powered chips that are connected in series, wherein in the case that the series power supply circuit is configured to comprise m-n layers of to-be-powered chips, the bottommost n layers of to-be-powered chips are replaced with conductor patches.

Other features and advantages of the present disclosure will become apparent through detailed descriptions of the illustrative embodiments of the present disclosure with reference to the following accompanying drawings.

BRIEF DESCRIPTION OF THE DRAWINGS

The drawings, which are incorporated in and constitute a part of this description, illustrate embodiments of the present disclosure and together with the description, serve to explain the principles of the present disclosure.

The present disclosure may be more clearly understood from the following detailed description with reference to the drawings, wherein.

Note that in the embodiments described below, the same reference sign sometimes is used in common between different drawings to denote the same part or parts having the same function, with omission of repeated description thereof. In the description, similar marks and letters represent similar items, so once a certain item is defined in one figure, no further discussion on it is required in the following figures.

To facilitate understanding, the positions, sizes, ranges, and the like of the respective structures shown in the drawings and the like sometimes do not indicate actual positions, sizes, ranges, and the like. Therefore, the disclosed invention is not limited to the positions, sizes, ranges and the like as disclosed in the drawings and the like. Furthermore, the drawings are not necessarily drawn in proportion, and some features may be exaggerated to show details of particular components.

DETAILED DESCRIPTION

Various illustrative embodiments of the present disclosure will now be described in details with reference to the accompanying drawings. It shall be noted that unless otherwise illustrated, relative arrangements, mathematic expressions and values of the components and steps illustrated in these embodiments do not limit the scope of the present disclosure.

The following descriptions on at least one illustrative embodiment are actually merely illustrative, and by no means serve as any limitation on the present disclosure or its application or utilization. That is, the circuits and methods herein are shown by way of examples to illustrate different embodiments of the circuits or methods in this disclosure and are not intended to be limiting. Those skilled in the art, however, will understand that they are merely illustrative, instead of exhaustive, of exemplary ways in which the present disclosure may be practiced.

Techniques, methods and devices that have already been known to ordinary technicians in the art may not be discussed here in detail, but under suitable circumstances, the techniques, methods and devices shall be deemed as parts of the granted description.

Embodiments of the present disclosure may be applied to computer systems/servers, and they are operational with numerous other general purpose or special purpose computing system environments or configurations. Examples of at least one of well-known computing systems, environments, and configurations that may be suitable for use with the computer systems/servers include, but are not limited to: personal computer systems, server computer systems, handheld or laptop devices, microprocessor-based systems, set-top boxes, programmable consumer electronics, network PCs, minicomputer systems, mainframe computer systems, and distributed cloud computing environments that include any of the above, etc.

The computer systems/servers may be described in the general context of computer system-executable instructions, such as program modules, being executed by the computer systems. Generally, program modules may include routines, programs, target programs, components, logic, data structures, etc., that perform particular tasks or implement particular abstract data types. The computer systems/servers may be practiced in the distributed cloud computing environments where tasks are performed by remote processing devices that are linked through a communications network. In the distributed cloud computing environments, program modules may be located in local or remote computer system storage media including memory storage devices.

Figure 1:
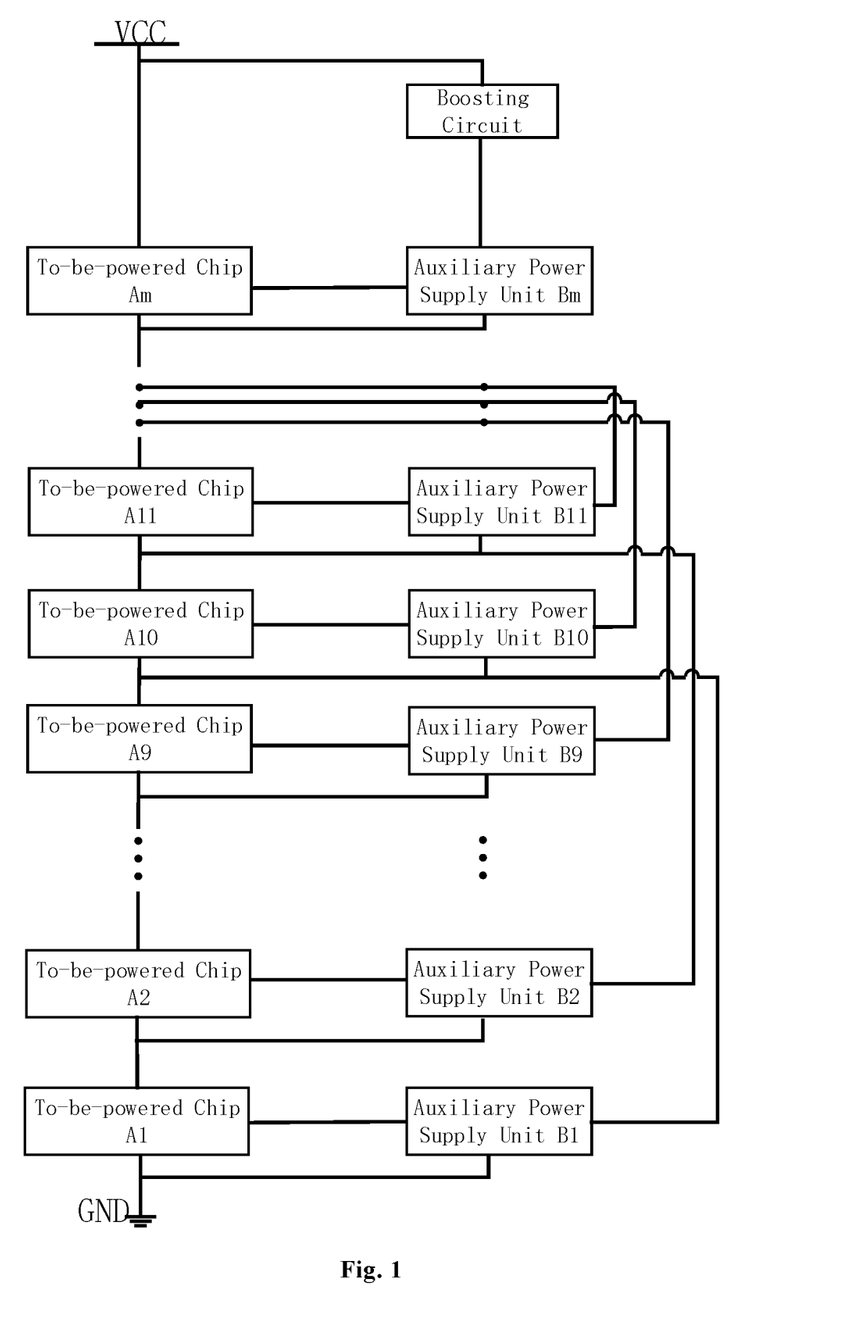
FIG. 1 schematically shows a schematic diagram of a series power supply circuit in the related art.

Referring to FIG. 1, a schematic diagram of a series power supply circuit in the related art is schematically shown. In specific practice, the core voltage (i.e., main operating voltage) for a large current of to-be-powered chips is usually supplied by a series circuit. A power supply negative electrode terminal of a higher-layer to-be-powered chip is used as a power supply terminal of a lower-layer to-be-powered chip, and a power supply negative electrode terminal of the lower-layer to-be-powered chip is used as a power supply terminal of an even-lower-layer to-be-powered chip, the chips being sequentially connected in series according to the connection relationship. Secondly, for the power supply of special functional components such as an I/O (input/output) interface, a PLL (phase Locking loop) circuit, and the like in each to-be-powered chip, the embodiment of the present disclosure supplies power through an auxiliary power supply unit that is disposed corresponding to a to-be-powered chip on the same layer. Specifically, for the sake of convenience, an introduction is made with the number of layers of to-be-powered chips as m in FIG. 1, in which the m layers of to-be-powered chips are referred to as a first to-be-powered chip A1, a second to-be-powered chip A2, . . . , a ninth to-be-powered chip A9, a tenth to-be-powered chip A10, an eleventh to-be-powered chip A11, . . . , and an m-th to-be-powered chip Am, respectively. Each layer of to-be-powered chips may include one to-be-powered chip or may include a plurality of to-be-powered chips that are connected in parallel in the same voltage domain, depending on circuit configuration and other reasons. The respective layers of to-be-powered chips are connected with a layer of auxiliary power supply units, wherein the respective auxiliary power supply units may be referred to as a first auxiliary voltage unit B1, a second auxiliary power supply unit B2, . . . , a ninth auxiliary power supply unit B9, a tenth auxiliary power supply unit B10, an eleventh auxiliary power supply unit B11, . . . , and an m-th auxiliary power supply unit Bm, respectively. Each layer of auxiliary power supply units may include one auxiliary power supply unit or a plurality of auxiliary power supply units, depending on the configuration of the to-be-powered chips and other factors.

As shown in FIG. 1, the series power supply circuit comprises m layers of to-be-powered chips between a power supply terminal VCC and a ground terminal GND, the m layers of to-be-powered chips are supplied with power in a series connected mode, and a voltage domain is formed on each layer of to-be-powered units. As a result, the series power supply circuit comprising the m layers of to-be-powered chips forms m layers of voltage domains connected in series, where m is an integer greater than 1. Each layer of to-be-powered chips has a main operating voltage input terminal, an auxiliary operating voltage input terminal and a power supply negative electrode terminal. The power supply terminal VCC is connected to the main operating voltage input terminal of the highest-layer to-be-powered chip Am. The power supply negative electrode terminal of each layer of to-be-powered chips is connected to the main operating voltage input terminal of a next-layer to-be-powered chips, so that each layer of to-be-powered chips is supplied with a main operating voltage through the main operating voltage input terminal; the series power supply circuit further comprises an auxiliary power supply unit that is disposed corresponding to each layer of to-be-powered chips. A power supply negative electrode terminal of each layer of auxiliary power supply units is connected to the power supply negative electrode terminal of the to-be-powered chips on the same layer. An output terminal of each layer of auxiliary power supply units is connected to the auxiliary operating voltage input terminal of the to-be-powered chips on the same layer, wherein an input terminal of at least one layer of auxiliary power supply units (for example, the auxiliary power supply unit Bm in FIG. 1) is connected to an external power supply terminal for supplying power, while input terminals of other respective layers of auxiliary power supply units are sequentially connected to main operating voltage input terminals of the corresponding layers of to-be-powered chips downwards from the highest-layer to-be-powered chips, so that the auxiliary power supply units supply an auxiliary operating voltage to the connected to-be-powered chips through the auxiliary operating voltage input terminals of the to-be-powered chips. Herein, the auxiliary power supply units may usually supply, using an LDO (low Dropout Regulator) module, an auxiliary operating voltage to some special functional modules such as an I/O (input/output) module, a PLL (phase locking loop) module, and the like in the connected to-be-powered chips.

In some embodiments, a case where the series power supply circuit comprises for example 40 layers of to-be-powered chips, that is, m=40, is described. In one example, the main operating voltage (i.e., core voltage) of each layer of to-be-powered chips may be 0.3V, and the following description is given by taking an example in which the power supply terminal VCC of the power source provides a 12V DC power supply voltage. However, it will be understood by those skilled in the art that the operating voltage enumerated herein is for convenience of description only. Of course, those skilled in the art should understand that, depending on the circuit hardware structure, circuit usage, power source configuration and other aspects, the main operating voltage of each layer of to-be-powered chips is not limited to 0.3V and the power supply voltage received by the power supply terminal VCC of the power source is not limited to the 12V DC power supply voltage. In one example, assuming that each layer of to-be-powered chips has the same internal resistance, the value of voltage input to the main operating voltage input terminal of each layer of to-be-powered chips is sequentially decreased, namely 12V, 11.7V, 11.4V, 11.1V . . . 0.3V, so that a main operating voltage of about 0.3V can be provided on each layer of to-be-powered chips.

Next, for the special functional components such as an input/output (I/O) interface, a PLL (Phase Locking loop), and the like in each layer of to-be-powered chips, in FIG. 1, power is supplied by an auxiliary operating voltage provided by an auxiliary power supply unit that is disposed correspondingly to a to-be-powered chip on the same layer, and the auxiliary operating voltage provided by the auxiliary power supply unit is generally greater than the main operating voltage of each layer of to-be-powered chips. In one example, an auxiliary operating voltage (i.e., I/O voltage and PLL voltage) provided by an auxiliary power supply unit to an auxiliary voltage input terminal of the connected to-be-powered chips may be about 1.8V, which is greater than the main operating voltage 0.3V of each layer of to-be-powered chips. Of course, it will be understood by those skilled in the art that the auxiliary operating voltage provided by the auxiliary power supply unit may be any suitable value, depending on the circuit configuration and other reasons.

In this example, since the auxiliary operating voltage provided by the auxiliary power supply unit to the auxiliary voltage input terminal of the connected to-be-powered chips is 6 times of the main operating voltage of the to-be-powered chips, in consideration of the voltage drop of the auxiliary power supply unit, low-layer auxiliary power supply units may be supplied voltage divided power supply by means of the main operating voltage of 8 layers (or fewer or more) layers of to-be-powered chips thereabove, so that each layer of auxiliary power supply units is kept being able to output an auxiliary operating voltage of about 1.8V. For example, in one example, as shown in FIG. 1, a power supply negative electrode terminal of a bottommost-layer to-be-powered chip A1 receives a ground voltage of 0V and a main operating voltage input terminal thereof receives an operating voltage of 0.3V, and further, a power supply negative electrode terminal of a layer-9 to-be-powered chip A9 receives a voltage of 2.4V and a main operating voltage input terminal thereof receives an operating voltage of 2.7V. At this time, an input terminal of the bottommost-layer auxiliary power supply unit B1 may receive the operating voltage of 2.7V from the main operating voltage input terminal of the layer-9 to-be-powered chip A9, and then the bottommost-layer auxiliary power supply unit B1 performs voltage regulation, so that an output terminal of the bottommost-layer auxiliary power supply unit B1 can provide an auxiliary operating voltage of about 1.8V to the connected to-be-powered chips via the auxiliary voltage input terminal of the to-be-powered chips. Thus, in one example, as shown in FIG. 1, the bottommost-layer auxiliary power supply unit B1 may provide the auxiliary operating voltage by means of the main operating voltage of the layer-9 to-be-powered chip A9, the layer-2 auxiliary power supply unit B2 may provide an auxiliary operating voltage by means of the main operating voltage of the layer-10 to-be-powered chip A10, the layer-9 auxiliary power supply unit B9 may provide an auxiliary operating voltage by means of the main operating voltage of the layer-17 to-be-powered chip A17 (not shown), the layer-10 auxiliary power supply unit B10 may provide an auxiliary operating voltage by means of the main operating voltage of the layer-18 to-be-powered chip A18 (not shown), the layer-11 auxiliary power supply unit B11 may provide an auxiliary operating voltage by means of the main operating voltage of the layer-19 to-be-powered chip B19 (not shown), and so on, the layer-32 auxiliary power supply unit may provide an auxiliary operating voltage by means of the main operating voltage (i.e., 12V) of the layer-40 to-be-powered chip (not shown). Therefore, the auxiliary power supply units of layers 1 to 32 may adopt, as the auxiliary operating voltage of the connected to-be-powered chips, the voltages which are led out from the main operating voltage input terminal of the higher-layer to-be-powered chip and are output after being regulated by the LDO or BUCK.

However, with respect to the current circuit structure, in this example, since auxiliary power supply units of for example the layer-33 to-be-powered chip and those on top of it require a higher voltage and cannot take power from the main operating voltage of the higher-layer to-be-powered chips, there needs another power source to provide a higher voltage source. For example, in a VCC 12V series system that is commonly used, there often needs a boosting circuit to boost the voltage and then the auxiliary power supply units of the to-be-powered chips of several highest layers are supplied with power via the LDO. Specifically, in some embodiments, the boosting circuit is connected to the power supply terminal VCC of the power source to receive a power supply voltage, and provides a boosted voltage to the above-mentioned external power supply terminal.

Specifically, in this example, for the layer-40 auxiliary power supply unit, since a sufficient voltage difference cannot be formed between the power supply voltage VCC of 12V and the voltage of 11.7V at the power supply negative electrode terminal of the layer-40 auxiliary power supply unit, there needs an additional boosting circuit to boost the voltage of 12V to for example at least 14.7V or more, so as to ensure that the auxiliary power supply unit can also provide an auxiliary operating voltage of 1.8V.

The present disclosure makes a description by taking as an example that each layer of auxiliary power supply units takes upwards the main operating voltage at the main operating voltage input terminal of 8 layers of to-be-powered chips to provide an input voltage for the auxiliary power supply units of this layer. However, those skilled in the art will appreciate that the present disclosure is not limited thereto. For example, in some embodiments, the auxiliary power supply units may be required to input a greater or smaller voltage to facilitate regulation, and then each layer of auxiliary power supply units may take upwards the main operating voltage of to-be-powered chips of 5, 6, 7, or more layers to provide an input voltage for the auxiliary power supply units of this layer.

Further, for example, in a structure in which the series power supply circuit comprises 35 to-be-powered chips, a 12V DC voltage is first converted to 10.5V by a DC-DC power supply module as a main operating voltage of the layer-35 (highest layer) to-be-powered chip Am.

Figure 2:
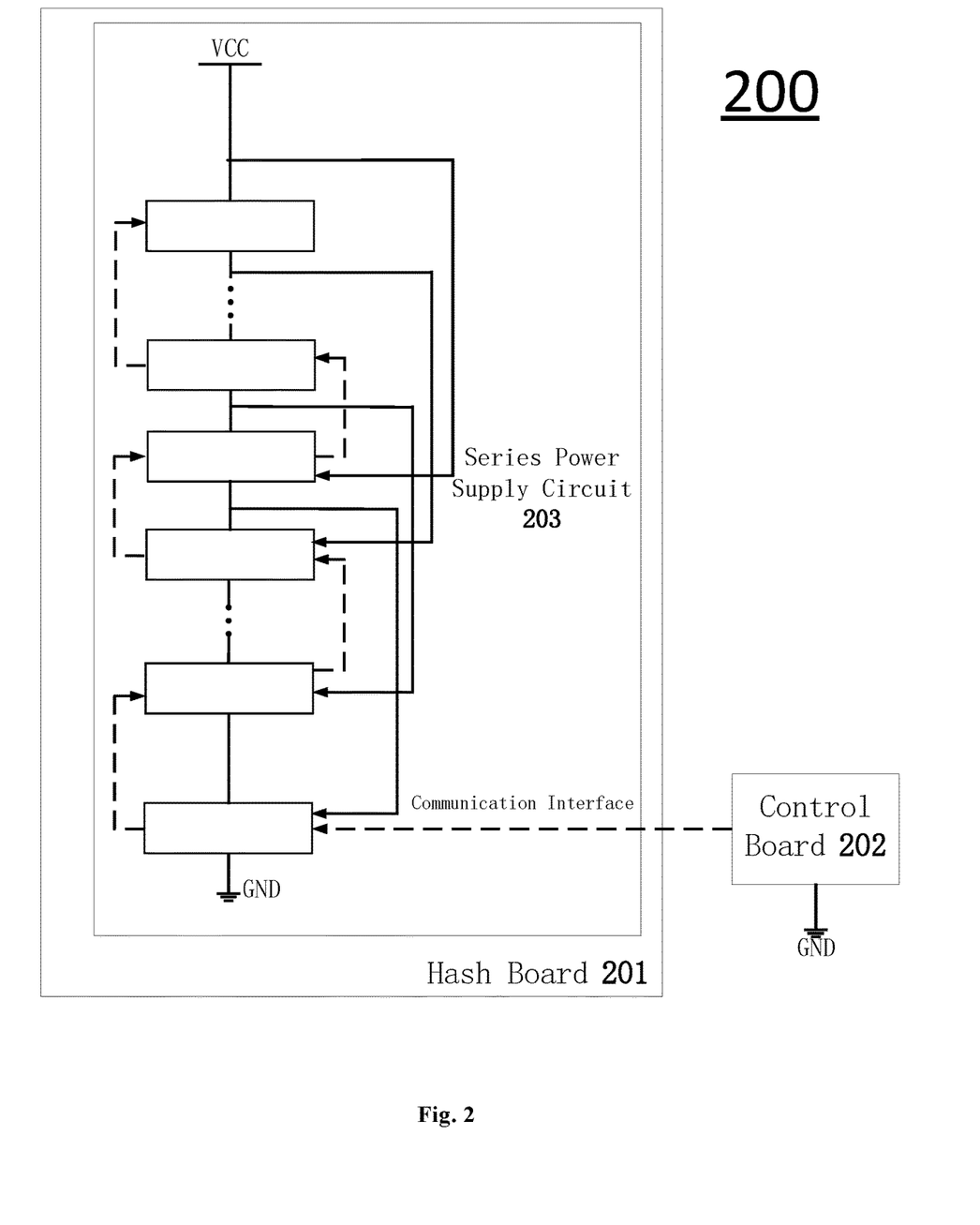
FIG. 2 schematically shows a structural block diagram of a computing device in the related art.

Referring to FIG. 2, a structural block diagram of a computing device 200 in the related art is schematically shown. In some embodiments, computing device 200 may be a data processing device. The computing device 200 may specifically comprise a hash board 201 and a control board 202.

The hash board 201 comprises a series power supply circuit 203 disposed thereon, which comprises m layers of to-be-powered chips that are connected in series between a power supply positive electrode of the hash board 201 and a power supply negative electrode of the hash board 201, where m is an integer greater than 2, wherein highest-layer to-be-powered chips among the m layers of to-be-powered chips are connected to the power supply positive electrode of the hash board 201, and bottommost-layer to-be-powered chips among the m layers of to-be-powered chips are connected to the power supply negative electrode of the hash board 201. The power supply positive electrode of the hash board 201 is configured to receive a power supply voltage VCC and the power supply negative electrode of the hash board 201 is configured to be grounded GND. The power supply voltage input, i.e., the voltage of about 12V of VCC (some use about 15V-18V, or higher voltage) provides a main operating voltage from the highest-layer to-be-powered chips to the bottommost-layer to-be-powered chips. For the current circuit structure, as shown in FIG. 1, the input voltage of the auxiliary power supply unit of each layer of to-be-powered chips is led out from the main operating voltage of the higher-layer to-be-powered chips or led out from the boosting circuit, and regulated by the LDO or BUCK, and provides an auxiliary operating voltage for the to-be-powered chips through the auxiliary voltage input terminal of the connected to-be-powered chips. As can be seen, in the example of FIG. 2, the high-layer to-be-powered chip or the additional boosting circuit (not shown) provides downwards an auxiliary operating voltage of the low-layer to-be-powered chip through an auxiliary power supply unit, as indicated by solid arrows in FIG. 2. For simplicity of the drawing, the auxiliary power supply unit and the boosting circuit and other related components in the series power supply circuit 203 are omitted in FIG. 2.

In general, the power supply negative electrode of the control board 202 may be grounded GND together with the power supply negative electrode of the hash board 201. Therefore, in the related art, the hash board 201 and the control board 202 each have the ground voltage of the power supply negative electrode as a reference voltage. Accordingly, the control board 202 is configured to provide control signals and communication signals to the hash board with the ground voltage as the reference voltage, and the control signals and the communication signals enter the series power supply circuit 203 from the control board 202 through a communication interface of the bottommost-layer to-be-powered chips in the series power supply circuit 203, pass through the inside of the to-be-powered chips, and are transmitted to upper layers stage by stage, as indicated by dashed arrows in FIG. 2.

However, as the current manufacturing process of data processing device chips gets more and more advanced, the chips thus produced are classified into more and more ranks. In order to decrease machine models, there will be cases in which chips of different ranks are connected in series with different numbers of layers to achieve identical overall machine parameters. Because of numerous chip ranks, there will cause one machine model with a variety of different circuit (different numbers of layers connected in series) forms, resulting in a wide variety of PCBs and difficult material control.

For example, in designing a circuit, when rank-A chips are used, 35 layers each having 3 chips need to be connected in series; when rank-B chips are used, 33 layers each having 3 chips need to be connected in series; when rank-C chips are used, 31 layers each having 3 chips need to be connected in series; machines made with the three ranks of chips can obtain the same or similar parameters, and in this way, when using the circuit with the structure of FIG. 2 to make PCBs, it is necessary to make circuits and PCBs of three specifications.

In view of the above circumstances, the present disclosure aims to provide a method for sharing one and the same kind of PCB in the case where chips in different layer levels are connected in series in a DC high-voltage series power supply circuit, and a corresponding computing device and compatible layout structure.

Figure 3:
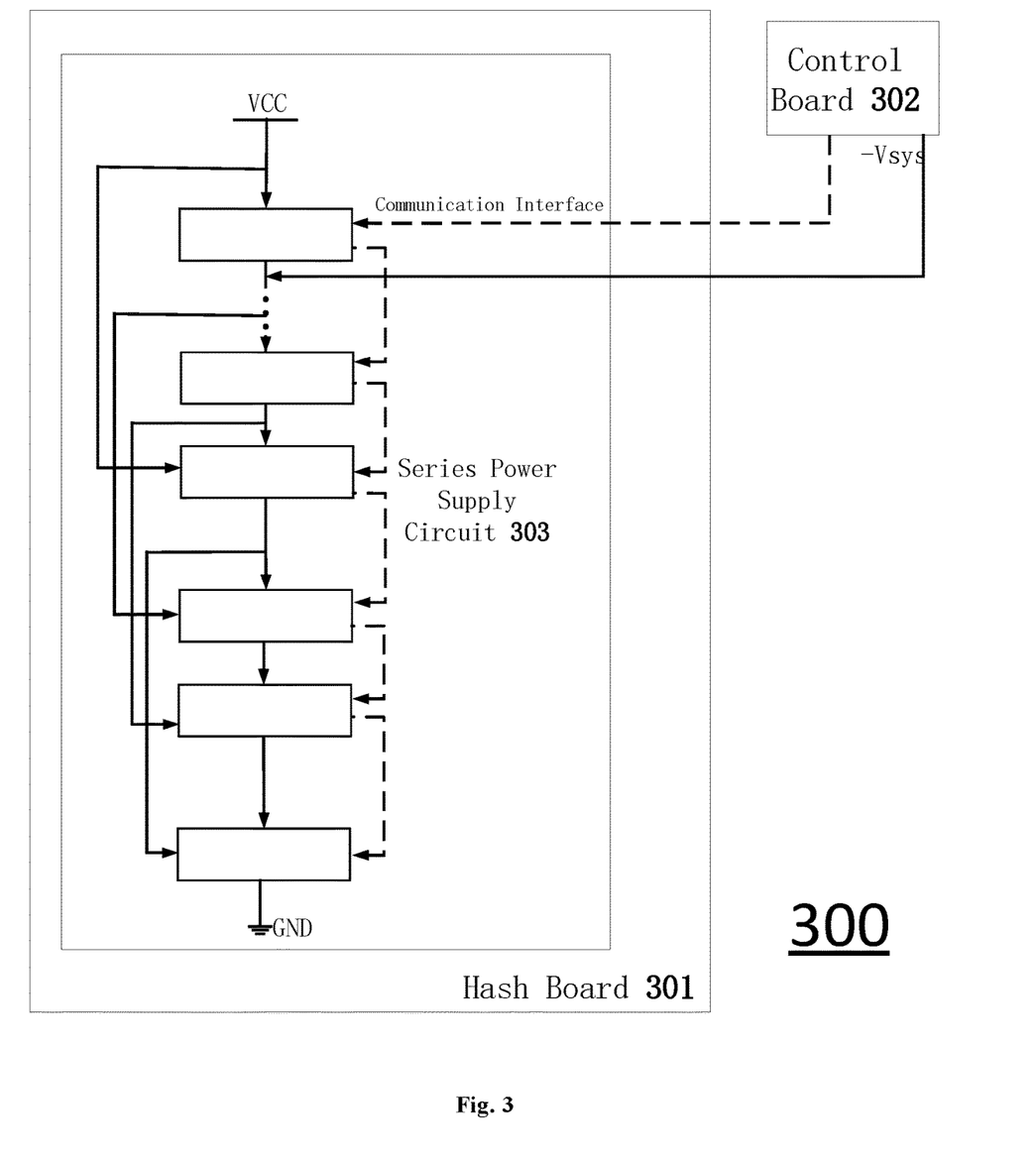
FIG. 3 schematically shows a structural block diagram of a computing device according to an embodiment of the present disclosure.

Referring to FIG. 3, a structural block diagram of a computing device 300 according to an embodiment of the present disclosure is schematically shown. In some embodiments, computing device 300 may be a data processing device. In this example, computing device 300 may specifically comprise a hash board 301 and a control board 302.

The hash board 301 comprises a series power supply circuit 303 disposed thereon, which includes m layers of to-be-powered chips that are connected in series between a power supply positive electrode of the hash board 301 and a power supply negative electrode of the hash board 301, where m is an integer greater than 2, wherein highest-layer to-be-powered chips among the m layers of to-be-powered chips are connected to the power supply positive electrode of the hash board 301, and bottommost-layer to-be-powered chips among the m layers of to-be-powered chips are connected to the power supply negative electrode of the hash board 301. The power supply positive electrode of the hash board 301 is configured to receive a higher potential relative to the power supply negative electrode of the hash board 31. In some embodiments, as shown in FIG. 3, the power supply positive electrode of the hash board 301 is configured to receive a power supply voltage VCC and the power supply negative electrode of the hash board 301 is configured to be grounded GND. Of course, the present disclosure is not limited thereto, and in other embodiments, the power supply positive electrode of the hash board 301 may be configured to be grounded and the power supply negative electrode of the hash board 301 may be configured to receive a negative power supply voltage; and in still other embodiments, the power supply positive electrode of the hash board 301 may be configured to receive a positive voltage, and the power supply negative electrode of the hash board 201 may be configured to receive a negative voltage, and a power supply negative electrode terminal of the highest-layer to-be-powered chips in the series power supply circuit 303 may be grounded, as long as high-layer to-be-powered chips can provide downwards an auxiliary operating voltage of low-layer to-be-powered chips through auxiliary power supply units. In some embodiments, as shown in FIG. 3, the power supply voltage input, i.e., the voltage of about 12V of VCC (some use about 15V-18V, or higher voltage) provides a main operating voltage from the highest-layer to-be-powered chips to the bottommost-layer to-be-powered chips. For the current circuit structure, as shown in FIG. 1, the input voltages of the auxiliary power supply units of each layer of to-be-powered chips are led out from the main operating voltage of the higher-layer to-be-powered chips or led out from the boosting circuit, and regulated by the LDO or BUCK, and provides an auxiliary operating voltage for the to-be-powered chips through the auxiliary voltage input terminal of the connected to-be-powered chips. As can be seen, in the example of FIG. 3, the high-layer to-be-powered chip or the additional boosting circuit (not shown) provides downwards an auxiliary operating voltage of the low-layer to-be-powered chip through an auxiliary power supply unit, as indicated by solid arrows in FIG. 3. For simplicity of the drawing, the auxiliary power supply unit and the boosting circuit and other related components in the series power supply circuit 303 are omitted in FIG. 3.

Further, in a case where the power supply positive electrode of the hash board 301 is configured to be grounded and the power supply negative electrode of the hash board 301 is configured to receive a negative power supply voltage, the main operating voltage is provided from the highest-layer to-be-powered chip to the bottommost-layer to-be-powered chip. For the current circuit structure, the input voltage of the auxiliary power supply unit of each layer of to-be-powered chips is led out from the main operating voltage of the higher-layer to-be-powered chips or led out from the control board, and regulated by the LDO or BUCK, and provides an auxiliary operating voltage for the to-be-powered chips through the auxiliary voltage input terminal of the connected to-be-powered chips. As can be seen, the high-layer to-be-powered chip or the control board (not shown in the figure) provides downwards an auxiliary operating voltage of the low-layer to-be-powered chip through an auxiliary power supply unit.

In addition, in order to achieve matching of the control signals and the communication signals, as shown in FIG. 3, the power supply negative electrode-Vsys of the control board 302 is not grounded, but may be connected to the power supply negative electrode terminal of the highest-layer to-be-powered chips in the series power supply circuit. In another case, under the circumstance in which the power supply positive electrode of the hash board 301 is grounded and the power supply negative electrode of the hash board 301 receives a negative power supply voltage, the power supply negative electrode-Vsys of the control board 302 may be connected to the power supply positive electrode of the hash board 301 or the power supply negative electrode-Vsys of the control board 302 may be connected to the power supply negative electrode terminal of the highest-layer to-be-powered chips in the series power supply circuit 303. Further, in some embodiments, in the case where the power supply positive electrode of the hash board 301 is configured to receive a positive voltage and the power supply negative electrode of the hash board 301 is configured to receive a negative voltage, the power supply negative electrode-Vsys of the control board 302 may be connected to the power supply negative electrode of the highest-layer to-be-powered chips in the series power supply circuit 303 and grounded. Therefore, in the present technical solution, the control signals and the communication signals from the control board 302 can be accessed through a communication interface of the highest-layer to-be-powered chips, and can be communicated to lower layers through the to-be-powered chips that are connected in series, as shown by dashed arrows in FIG. 3. In addition, the control signals and the communication signals of the control board 302 may be connected to the communication and control signals of the highest-layer to-be-powered chips by means of common level shifting or isolation, so as to achieve signal level matching. The means of level shifting or isolation may include, for example, optical coupling, transformers, capacitive coupling, network interfaces, and the like. For simplicity of the drawing, level shifting or isolation is not shown in FIG. 3. As can be seen, in the example of FIG. 3, the control signals and the communication signals of a communication line are from top to bottom.

In another example, the power supply negative electrode-Vsys of the control board 302 may be connected to a power supply negative electrode terminal of to-be-powered chips of layers other than the highest layer, and signal level matching is achieved by appropriate level shifting or isolation chip.

Therefore, in the present embodiment, both the power supply line and the communication line are from top to bottom. Accordingly, the present disclosure may provide a method for realizing identical overall machine parameters with a PCB design to be compatible with different ranks of chips. The main method is that in designing a PCB, it is designed according to a maximum number of layers connected in series that are likely to be used, and when pasting chips in producing process, in case where fewer layers need to be connected in series, the unused layers are directly pasted into conductor patches (such as copper sheets) to retain current channels.

However, in the existing solutions, high-layer chips cannot be replaced with copper sheets as they need to provide an auxiliary operating voltage to low-layer chips, and the low-layer chips cannot be replaced with copper sheets, either, as the communication channels are connected in series from the low-layer chips to the high-layer chips.

In the chips series-connected circuit disclosed by the present disclosure, the control signals and the communication signals of the control board are accessed from the higher-layer chips and are transmitted to the low-layer chips through the chips connected in series. The control signals and the communication signals of the control board are connected to the communication signals and the control signals of the highest-layer chips by level shifting or chip isolation. In this way, an auxiliary power supply supplies power downwards from high layers, the communication signals are also transmitted downwards from the high layers, and for bottommost-layer chips, upon the necessity of decreasing layers, they can be replaced with copper sheets without influencing normal operation of the entire circuit.

For example, in designing a circuit, when rank-A chips are used, 35 layers each having 3 chips need to be connected in series; when rank-B chips are used, 33 layers each having 3 chips need to be connected in series; when rank-C chips are used, 31 layers each having 3 chips need to be connected in series; machines made with the three ranks of chips can obtain the same or similar parameters, and in this way, when using the circuit with the structure of FIG. 2 to make PCBs, it is necessary to make circuits and PCBs of three specifications. However, when using the circuit with the structure of FIG. 3, it is possible to make a circuit and PCB of only one specification, with only 35 layers connected in series. When a 33-layer structure is used, it is only necessary to change main chips of the lowest two layers into copper sheets, and peripheral supporting resistors, capacitors, LDOs, etc. may not be attached; for a circuit with 31 layers connected in series, the same operation scheme applies, and chips of the lowest 4 layers are replaced with copper sheets.

Figure 4:
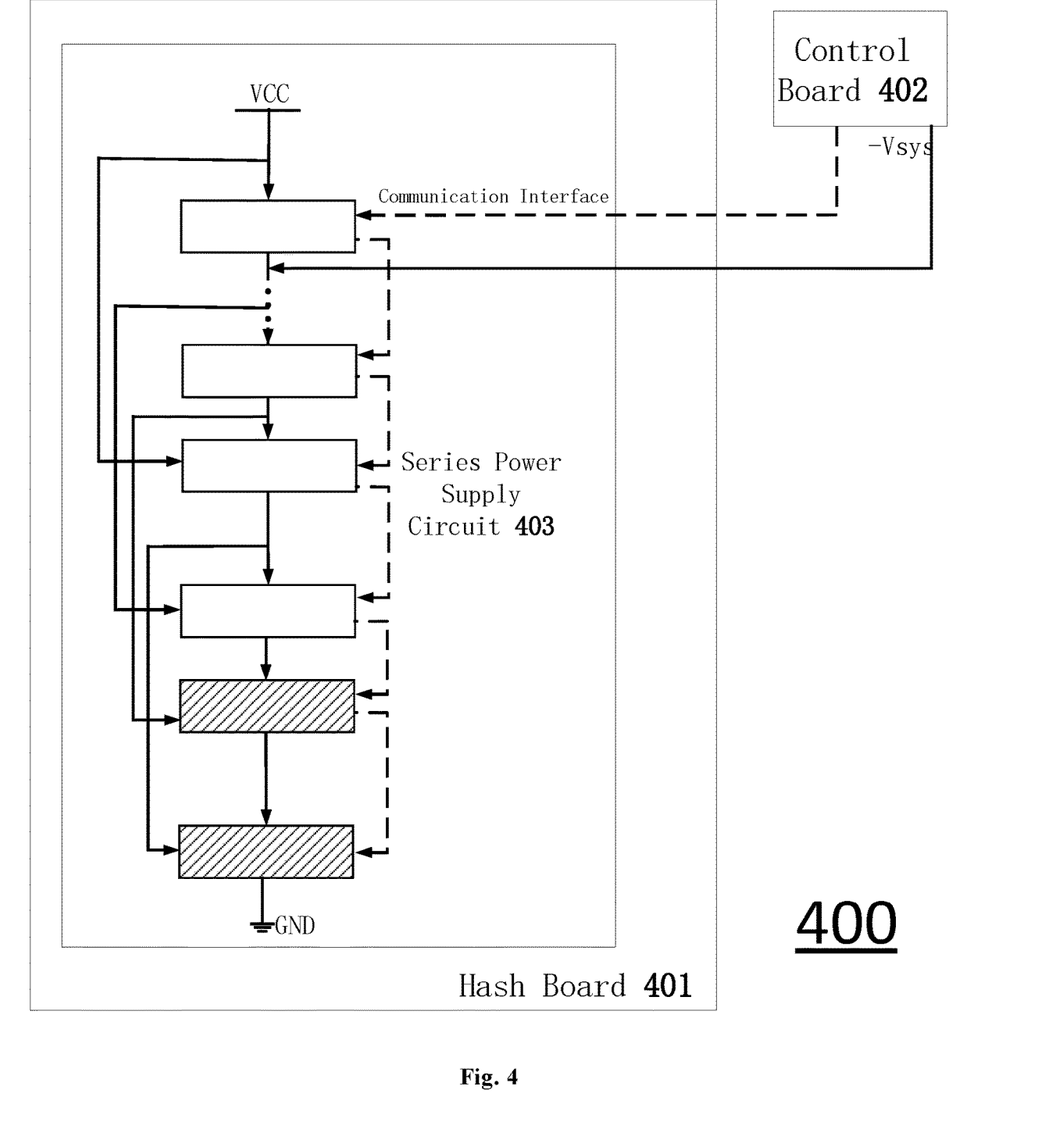
FIG. 4 schematically shows another structural block diagram of a computing device according to an embodiment of the present disclosure.

FIG. 4 schematically illustrates another structural block diagram of a computing device 400 according to an embodiment of the present disclosure. The computing device 400 in FIG. 4 is similar in structure to the computing device 300 in FIG. 3, and comprises a hash board 401 and a control board 402 that are respectively similar to the hash board 301 and the control board 302 in FIG. 3, wherein the hash board 401 includes a series power supply circuit 403. In the example shown in FIG. 4, chips of the lowest 2 layers (e.g., to-be-powered chips A1-A2 in FIG. 1) are replaced with copper sheets, and the corresponding auxiliary power supply units (e.g., auxiliary power supply units B1-B2 in FIG. 1) are not attached. In other embodiments, chips of the lowest more or fewer layers may be replaced with copper sheets, the corresponding auxiliary power supply units being not attached.

Therefore, the present disclosure may provide a method for realizing identical overall machine parameters with a PCB design to be compatible with different ranks of chips.

Figure 5:
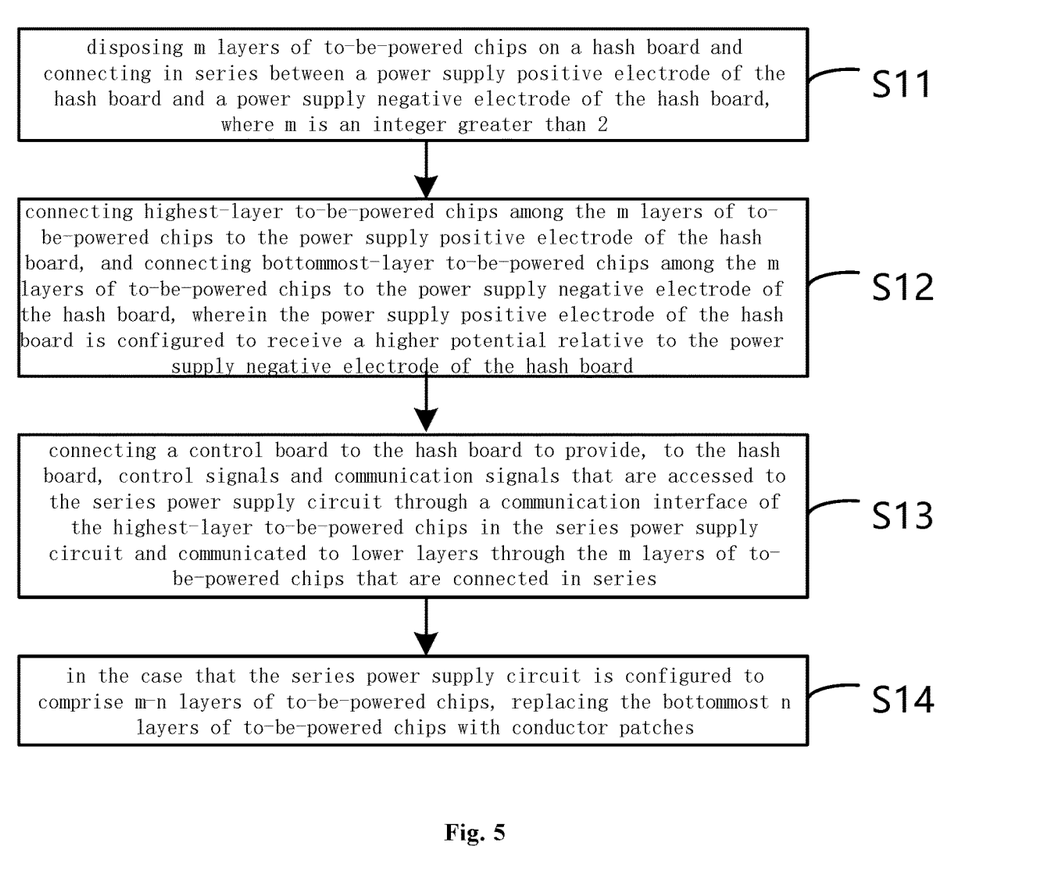
FIG. 5 schematically shows a flow chart of one implementation mode of a series power supply method according to an embodiment of the present disclosure.

FIG. 5 schematically shows a flow chart of an implementation mode of a series power supply method according to an embodiment of the present disclosure. As shown in FIG. 5, a series power supply method according to an embodiment of the present disclosure is used for supplying power to a series power supply circuit comprising m layers of to-be-powered chips, the method comprising:

step S11 of disposing m layers of to-be-powered chips on a hash board and connecting in series between a power supply positive electrode of the hash board and a power supply negative electrode of the hash board, where m is an integer greater than 2.

Step S12 of connecting highest-layer to-be-powered chips among the m layers of to-be-powered chips to the power supply positive electrode of the hash board, and connecting bottommost-layer to-be-powered chips among the m layers of to-be-powered chips to the power supply negative electrode of the hash board, wherein the power supply positive electrode of the hash board is configured to receive a higher potential relative to the power supply negative electrode of the hash board.

In some embodiments, each layer of to-be-powered chips has a main operating voltage input terminal, an auxiliary operating voltage input terminal and a power supply negative electrode terminal, the method comprising: connecting the power supply positive electrode of the hash board to the main operating voltage input terminal of the highest-layer to-be-powered chips, the power supply negative terminal of each layer of to-be-powered chips being connected to the main operating voltage input terminal of next-layer to-be-powered chips, so that each layer of to-be-powered chips is supplied with a main operating voltage through the main operating voltage input terminal; connecting a power supply negative electrode terminal of each layer of auxiliary power supply units disposed corresponding to each layer of to-be-powered chips to the power supply negative electrode terminal of the to-be-powered chips on the same layer, an output terminal of each layer of auxiliary power supply units being connected to an auxiliary operating voltage input terminal of the to-be-powered chips on the same layer, wherein an input terminal of at least one layer of auxiliary power supply units is connected to an external power supply terminal for supplying power, while input terminals of other respective layers of auxiliary power supply units are sequentially connected to main operating voltage input terminals of the corresponding layers of to-be-powered chips downwards from the highest-layer to-be-powered chips, so that the connected to-be-powered chips are supplied with an auxiliary operating voltage through the auxiliary operating voltage input terminals.

Step S13 of connecting the control board to the hash board to provide control signals and communication signals to the hash board, the control signals and the communication signals being accessed to the series power supply circuit through a communication interface of highest-layer to-be-powered chips in the series power supply circuit, and communicated to lower layers through the m layers of to-be-powered chips connected in series. In some embodiments, in the case where the power supply positive electrode of the hash board is configured to receive a power supply voltage and the power supply negative electrode of the hash board is configured to be grounded, the series power supply method further comprises connecting an input terminal of a boosting circuit to the power supply positive electrode of the hash board and connecting an output terminal thereof to an external power supply terminal. In other embodiments, in the case where the power supply positive electrode of the hash board is configured to be grounded and the power supply negative electrode of the hash board is configured to receive a negative power supply voltage, the series power supply method further comprises configuring a regulating circuit included in the control board to provide a regulated voltage to the external power supply terminal.

In some embodiments, the series power supply method further comprises connecting the power supply negative electrode of the control board to the power supply negative electrode terminal of the highest-layer to-be-powered chips in the series power supply circuit.

Step S14 of, in the case where the series power supply circuit is configured to comprise m-n layers of to-be-powered chips, replacing the bottommost n layers of to-be-powered chips with conductor patches.

In some embodiments, in the case where the series power supply circuit is configured to comprise m-n layers of to-be-powered chips, the series power supply method further comprises removing bottommost n layers of auxiliary power supply units corresponding to the bottommost n layers of to-be-powered chips.

In all examples shown and discussed herein, any specific value should be construed as exemplary only and not as limiting. Thus, other examples of the exemplary embodiments may have different values.

According to an aspect of the present disclosure, there is provided a computing device comprising: a hash board, comprising a series power supply circuit disposed thereon, which includes m layers of to-be-powered chips that are connected in series between a power supply positive electrode of the hash board and a power supply negative electrode of the hash board, where m is an integer greater than 2, wherein highest-layer to-be-powered chips among the m layers of to-be-powered chips are connected to the power supply positive electrode of the hash board, and bottommost-layer to-be-powered chips among the m layers of to-be-powered chips are connected to the power supply negative electrode of the hash board, wherein the power supply positive electrode of the hash board is configured to receive a higher potential relative to the power supply negative electrode of the hash board; a control board, configured to provide, to the hash board, control signals and communication signals that are accessed to the series power supply circuit through a communication interface of the highest-layer to-be-powered chips in the series power supply circuit and communicated to lower layers through the m layers of to-be-powered chips that are connected in series, wherein in the case that the series power supply circuit on the hash board is configured to comprise m-n layers of to-be-powered chips, the bottommost n layers of to-be-powered chips are replaced with conductor patches.

In some embodiments, each layer of to-be-powered chips has a main operating voltage input terminal, an auxiliary operating voltage input terminal and a power supply negative terminal. The power supply positive electrode of the hash board is connected to the main operating voltage input terminal of the highest-layer to-be-powered chips, and the power supply negative terminal of each layer of to-be-powered chips is connected to the main operating voltage input terminal of next-layer to-be-powered chips, so that each layer of to-be-powered chips is supplied with a main operating voltage through the main operating voltage input terminal. The power supply negative electrode terminal of each layer of auxiliary power supply units disposed corresponding to each layer of to-be-powered chips is connected to the power supply negative electrode terminal of the to-be-powered chips of the same layer, and an output terminal of each layer of auxiliary power supply units is connected to an auxiliary operating voltage input terminal of the to-be-powered chips of the same layer, wherein an input terminal of at least one layer of auxiliary power supply units is connected to an external power supply terminal for supplying power, while input terminals of other respective layers of auxiliary power supply units are sequentially connected to main operating voltage input terminals of the corresponding layers of to-be-powered chips downwards from the highest-layer to-be-powered chips, so that the connected to-be-powered chips are supplied with an auxiliary operating voltage through the auxiliary operating voltage input terminals.

In some embodiments, the power supply negative electrode of the control board is connected to the power supply negative electrode terminal of the highest-layer to-be-powered chips in the series power supply circuit.

In some embodiments, in the case where the series power supply circuit is configured to comprise m-n layers of to-be-powered chips, the bottommost n layers of auxiliary power supply units corresponding to the bottommost n layers of to-be-powered chips are removed.

In some embodiments, the power supply positive electrode of the hash board is configured to receive a power supply voltage and the power supply negative electrode of the hash board is configured to be grounded.

In some embodiments, the power supply positive electrode of the hash board is configured to be grounded and the power supply negative electrode of the hash board is configured to receive a negative power supply voltage.

In some embodiments, the series power supply circuit further comprises a boosting circuit having an input terminal connected to the power supply positive electrode of the hash board, and an output terminal connected to the external power supply terminal.

In some embodiments, the control board includes a regulating circuit configured to provide a regulated voltage to the external power supply terminal.

According to another aspect of the present disclosure, there is provided a series power supply method for supplying power to a series power supply circuit comprising m layers of to-be-powered chips, the series power supply method comprising: disposing the m layers of to-be-powered chips on a hash board and connecting in series between a power supply positive electrode of the hash board and a power supply negative electrode of the hash board, where m is an integer greater than 2; connecting highest-layer to-be-powered chips among the m layers of to-be-powered chips to the power supply positive electrode of the hash board, and connecting bottommost-layer to-be-powered chips among the m layers of to-be-powered chips to the power supply negative electrode of the hash board, wherein the power supply positive electrode of the hash board is configured to receive a higher potential relative to the power supply negative electrode of the hash board; connecting a control board to the hash board to provide, to the hash board, control signals and communication signals that are accessed to the series power supply circuit through a communication interface of the highest-layer to-be-powered chips in the series power supply circuit and communicated to lower layers through the m layers of to-be-powered chips that are connected in series, wherein in the case that the series power supply circuit is configured to comprise m-n layers of to-be-powered chips, the bottommost n layers of to-be-powered chips are replaced with conductor patches.

In some embodiments, each layer of to-be-powered chips has a main operating voltage input terminal, an auxiliary operating voltage input terminal and a power supply negative terminal. The series power supply method comprises: connecting the power supply positive electrode of the hash board to the main operating voltage input terminal of the highest-layer to-be-powered chips, the power supply negative terminal of each layer of to-be-powered chips being connected to the main operating voltage input terminal of next-layer to-be-powered chips, so that each layer of to-be-powered chips is supplied with a main operating voltage through the main operating voltage input terminal; connecting the power supply negative electrode terminal of each layer of auxiliary power supply units disposed corresponding to each layer of to-be-powered chips to the power supply negative electrode terminal of the to-be-powered chips of the same layer, an output terminal of each layer of auxiliary power supply units being connected to an auxiliary operating voltage input terminal of the to-be-powered chips of the same layer, wherein an input terminal of at least one layer of auxiliary power supply units is connected to an external power supply terminal for supplying power, while input terminals of other respective layers of auxiliary power supply units are sequentially connected to main operating voltage input terminals of the corresponding layers of to-be-powered chips downwards from the highest-layer to-be-powered chips, so that the connected to-be-powered chips are supplied with an auxiliary operating voltage through the auxiliary operating voltage input terminals.

In some embodiments, the series power supply method further comprises connecting a power supply negative electrode of the control board to a power supply negative terminal of the highest-layer to-be-powered chips in the series power supply circuit.

In some embodiments, in the case where the series power supply circuit is configured to comprise m-n layers of to-be-powered chips, the series power supply method further comprises removing the bottommost n layers of auxiliary power supply units corresponding to the bottommost n layers of to-be-powered chips.

In some embodiments, the series power supply method further comprises configuring the power supply positive electrode of the hash board to receive a power supply voltage and configuring the power supply negative electrode of the hash board to be grounded.

In some embodiments, the series power supply method further comprises configuring the power supply positive electrode of the hash board to be grounded and the power supply negative electrode of the hash board to receive a negative power supply voltage.

In some embodiments, the series power supply method further comprises connecting an input terminal of a boosting circuit to the power supply positive electrode of the hash board, and connecting an output terminal thereof to the external power supply terminal.

In some embodiments, the series power supply method further comprises configuring a regulating circuit included in the control board to provide a regulated voltage to the external power supply terminal.

The terms "front", "back", "top", "bottom", "over", "under" and the like in the description and in the claims, if any, are used for descriptive purposes and not necessarily for describing constant relative positions. It is to be understood that the terms thus used are interchangeable under appropriate circumstances such that the embodiments of the disclosure as described herein are, for example, capable of being operated in other orientations different than those as illustrated or otherwise described herein.

As used herein, the word "exemplary" means "serving as an example, instance, or illustration", instead of serving as a "model" that is to be accurately reproduced. Any implementation illustratively described herein is not necessarily to be construed as preferred or advantageous over other implementations. Furthermore, the present disclosure is not limited by any expressed or implied theory presented in the preceding parts of Technical Field, Background Art, Contents of the Invention or Embodiment.

As used herein, the term "substantially" is intended to encompass any minor variation caused by design or manufacturing imperfections, tolerances of devices or components, environmental influences, and/or other factors. The word "substantially" also allows for differences from a perfect or ideal situation due to parasitic effects, noise, and other practical considerations that may exist in a practical implementation.

The above description may indicate elements or nodes or features that are "connected" or "coupled" together. As used herein, the term "connecting" means one element/node/feature is electronically, mechanically, logically or otherwise directly connected (or directly communicates) with another element/node/feature, unless otherwise explicitly illustrated. Similarly, unless otherwise explicitly illustrated, the term "coupling" means one element/node/feature may be mechanically, electronically, logically or otherwise linked to another element/node/feature in a directly or indirect manner to allow an interaction therebetween, even if these two features may not be connected directly. In other words, the term "coupling" intends to include directly links and indirect links between elements or other features, including connections through one or more intermediate elements.

It will be further understood that the term "comprising/including", when used herein, specifies the presence of stated features, integers, steps, operations, units and/or components, but the presence or addition of one or more other features, integers, steps, operations, units and/or components, and/or combinations thereof are not excluded.

It shall be realized by those skilled in the art that boundaries between said operations are only illustrative. Multiple operations may be combined into a single operation, and a single operation may be distributed in additional operations, and moreover, the operations may be performed in an at least partially overlapping manner in time. Furthermore, optional embodiments may include multiple examples of specific operations, and the operation sequence may be changed in various other embodiments. However, other modifications, changes and replacements are also possible. Thus, the description and drawings shall be deemed as illustrative instead of limitative.

Although some specific embodiments of the present disclosure have been illustrated by ways of examples in detail, it shall be understood by those skilled in the art that the above examples are only illustrative, but shall by no means limit the scope of the present disclosure. It shall further be understood by those skilled in the art that multiple amendments may be made to the examples, without departure from the scope and spirits of the present disclosure. The scope of the present disclosure is defined by the attached claims.

What is claimed is:

1. A computing device, comprising:
   a hash board, comprising a series power supply circuit disposed thereon, which includes m layers of to-be-powered chips that are connected in series between a power supply positive electrode of the hash board and a power supply negative electrode of the hash board, where m is an integer greater than 2, wherein highest-layer to-be-powered chips among the m layers of to-be-powered chips are connected to the power supply positive electrode of the hash board, and bottommost-layer to-be-powered chips among the m layers of to-be-powered chips are connected to the power supply negative electrode of the hash board, wherein the power supply positive electrode of the hash board is configured to receive a higher potential relative to the power supply negative electrode of the hash board; and
   a control board, configured to provide, to the hash board, control signals and communication signals that are accessed to the series power supply circuit through a communication interface of the highest-layer to-be-powered chips in the series power supply circuit and communicated to lower layers through the m layers of to-be-powered chips that are connected in series,
   wherein in the case that the series power supply circuit on the hash board is configured to comprise m-n layers of to-be-powered chips, the bottommost n layers of to-be-powered chips are replaced with conductor patches.

2. The computing device of claim 1, wherein:
   each layer of to-be-powered chips has a main operating voltage input terminal, an auxiliary operating voltage input terminal and a power supply negative terminal, the power supply positive electrode of the hash board being connected to the main operating voltage input terminal of the highest-layer to-be-powered chips, the power supply negative terminal of each layer of to-be-powered chips being connected to the main operating voltage input terminal of next-layer to-be-powered chips, so that each layer of to-be-powered chips is supplied with a main operating voltage through the main operating voltage input terminal; and
   each layer of auxiliary power supply units is disposed corresponding to each layer of to-be-powered chips, a power supply negative electrode terminal of each layer of auxiliary power supply units being connected to the power supply negative electrode terminal of the to-be-powered chips of the same layer, an output terminal of each layer of auxiliary power supply units being connected to an auxiliary operating voltage input terminal of the to-be-powered chips of the same layer, wherein an input terminal of at least one layer of auxiliary power supply units is connected to an external power supply terminal for supplying power, while input terminals of other respective layers of auxiliary power supply units are sequentially connected to main operating voltage input terminals of the corresponding layers of to-be-powered chips downwards from the highest-layer to-be-powered chips, so that the connected to-be-powered chips are supplied with an auxiliary operating voltage through the auxiliary operating voltage input terminals.

3. The computing device of claim 1, wherein the power supply negative electrode of the control board is connected to the power supply negative electrode terminal of the highest-layer to-be-powered chips in the series power supply circuit.

4. The computing device of claim 1, wherein in the case where the series power supply circuit is configured to comprise m-n layers of to-be-powered chips, the bottommost n layers of auxiliary power supply units corresponding to the bottommost n layers of to-be-powered chips are removed.

5. The computing device of claim 2, wherein the power supply positive electrode of the hash board is configured to receive a power supply voltage and the power supply negative electrode of the hash board is configured to be grounded.

6. The computing device of claim 2, wherein the power supply positive electrode of the hash board is configured to be grounded and the power supply negative electrode of the hash board is configured to receive a negative power supply voltage.

7. The computing device of claim 5, wherein the series power supply circuit further comprises a boosting circuit having an input terminal connected to the power supply positive electrode of the hash board, and an output terminal connected to the external power supply terminal.

8. The computing device of claim 6, wherein the control board includes a regulating circuit configured to provide a regulated voltage to the external power supply terminal.

9. A series power supply method, for supplying power to a series power supply circuit comprising m layers of to-be-powered chips, wherein the series power supply method comprises:
disposing the m layers of to-be-powered chips on a hash board and connecting in series between a power supply positive electrode of the hash board and a power supply negative electrode of the hash board, where m is an integer greater than 2,
connecting highest-layer to-be-powered chips among the m layers of to-be-powered chips to the power supply positive electrode of the hash board, and connecting bottommost-layer to-be-powered chips among the m layers of to-be-powered chips to the power supply negative electrode of the hash board, wherein the power supply positive electrode of the hash board is configured to receive a higher potential relative to the power supply negative electrode of the hash board; and
connecting a control board to the hash board to provide, to the hash board, control signals and communication signals that are accessed to the series power supply circuit through a communication interface of the highest-layer to-be-powered chips in the series power supply circuit and communicated to lower layers through the m layers of to-be-powered chips that are connected in series,
wherein in the case that the series power supply circuit is configured to comprise m-n layers of to-be-powered chips, the bottommost n layers of to-be-powered chips are replaced with conductor patches.

10. The series power supply method of claim 9, each layer of to-be-powered chips having a main operating voltage input terminal, an auxiliary operating voltage input terminal and a power supply negative terminal, wherein the series power supply method comprises:
connecting the power supply positive electrode of the hash board to the main operating voltage input terminal of the highest-layer to-be-powered chips, the power supply negative terminal of each layer of to-be-powered chips being connected to the main operating voltage input terminal of next-layer to-be-powered chips, so that each layer of to-be-powered chips is supplied with a main operating voltage through the main operating voltage input terminal; and
connecting a power supply negative electrode terminal of each layer of auxiliary power supply units disposed corresponding to each layer of to-be-powered chips to a power supply negative electrode terminal of the to-be-powered chips of the same layer, an output terminal of each layer of auxiliary power supply units being connected to an auxiliary operating voltage input terminal of the to-be-powered chips of the same layer, wherein an input terminal of at least one layer of auxiliary power supply units is connected to an external power supply terminal for supplying power, while input terminals of other respective layers of auxiliary power supply units are sequentially connected to main operating voltage input terminals of the corresponding layers of to-be-powered chips downwards from the highest-layer to-be-powered chips, so that the connected to-be-powered chips are supplied with an auxiliary operating voltage through the auxiliary operating voltage input terminals.

11. The series power supply method of claim 9, wherein the series power supply method further comprises connecting the power supply negative electrode of the control board to the power supply negative electrode terminal of the highest-layer to-be-powered chips in the series power supply circuit.

12. The series power supply method of claim 9, wherein in the case where the series power supply circuit is configured to comprise m-n layers of to-be-powered chips, the series power supply method further comprises removing the bottommost n layers of auxiliary power supply units corresponding to the bottommost n layers of to-be-powered chips.

13. The series power supply method of claim 10, wherein the series power supply method further comprises configuring the power supply positive electrode of the hash board to receive a power supply voltage and configuring the power supply negative electrode of the hash board to be grounded.

14. The series power supply method of claim 10, wherein the series power supply method further comprises configuring the power supply positive electrode of the hash board to be grounded and configuring the power supply negative electrode of the hash board to receive a negative power supply voltage.

15. The series power supply method of claim 13, wherein the series power supply method further comprises connecting an input terminal of a boosting circuit to the power supply positive electrode of the hash board, and an output terminal thereof to the external power supply terminal.

16. The series power supply method of claim 14, wherein the series power supply method further comprises configuring a regulating circuit included in the control board to provide a regulated voltage to the external power supply terminal.

* * * * *